United States Patent [19]

Miller

[11] Patent Number: 4,680,769

[45] Date of Patent: Jul. 14, 1987

[54] BROADBAND LASER AMPLIFIER STRUCTURE

[75] Inventor: Stewart E. Miller, Middletown Township, Monmouth County, N.J.

[73] Assignee: Bell Communications Research, Inc., Livingston, N.J.

[21] Appl. No.: 673,584

[22] Filed: Nov. 21, 1984

[51] Int. Cl.$^4$ .......................... H01S 3/098; H01S 3/10
[52] U.S. Cl. ........................................ 372/50; 372/19; 372/20; 372/97
[58] Field of Search ....................... 372/50, 19, 20, 92, 372/97, 108; 350/96.11; 330/4.3

[56] References Cited

U.S. PATENT DOCUMENTS

| | | | |
|---|---|---|---|
| 3,747,021 | 7/1973 | Smiley | 372/39 |
| 3,904,982 | 9/1975 | Dienes et al. | 372/53 |
| 4,039,249 | 8/1977 | Kaminow et al. | 350/96.11 |
| 4,121,178 | 10/1978 | Schlossberg | 372/32 |
| 4,125,816 | 11/1978 | Boling et al. | 372/68 |
| 4,318,059 | 3/1982 | Lang et al. | 372/47 |
| 4,573,156 | 2/1986 | Anthony et al. | 372/92 |
| 4,589,115 | 5/1986 | Burnham et al. | 372/92 |

FOREIGN PATENT DOCUMENTS 0015279  2/1977  Japan ..................................... 372/19

OTHER PUBLICATIONS

"Dual Wavelength InGaAsP/InP TJS Lasers", *Electronic Letters*, S. Sakai, T. Aoki And M. Umeno, vol. 18, No. 1, Jan. 7, 1982, pp. 18-20.
"High Quality Antireflection Coating on Laser Facets by Sputtered Silicon Nitride", by G. Eisenstein and L. W. Stulz, *App. Op.*, vol. 23, No. 1, Jan. 1, 1984, pp. 161-164.
*Technical Digest OFC '84*—O.S.A. Meeting on Optical Fiber Communication, Jan. 23-25, 1984, paper MF2.
"Tunable Optical Waveguide Directional Coupler Filter", by R. C. Alferness and R. V. Schmidt, *App. Phys. Lett.*, vol. 33, No. 2, 15 Jul. 1978, pp. 161-163.

*Primary Examiner*—James W. Davie
*Attorney, Agent, or Firm*—James W. Falk; Stephen M. Gurey

[57] ABSTRACT

An injection laser fabricated in accordance with the teachings of the present invention comprises a laser cavity having first and second active laser regions disposed in tandem therein, means for injecting current into the first and second active laser regions to provide gain distributions over wavelength regions in the two active laser regions which partially overlap to form a combined gain distribution over a range of wavelengths and means for providing wavelength within the range. In various embodiments of the present invention, the means for providing wavelength selective reflector or means for coupling energy out of the active regions. Moreover, the wavelength of the output radiation in various embodiments is determined by the values of the injected current density in the two active laser regions and the relative magnitudes of the loss at specific wavelengths.

25 Claims, 12 Drawing Figures

BROADBAND LASER AMPLIFIER STRUCTURE

BACKGROUND OF THE INVENTION

This invention relates to the field of lasers and more specifically to the field of injection lasers, whether used on oscillator light sources or amplifiers.

Initial interest in the laser was, in part, due to well-defined emission modes resulting in exceedingly narrow linewidth output. However, this very characteristic severely limits the available wavelengths of coherent light sources.

Because optical communications systems are being designed to transmit at several different wavelengths, there now exists a need for lasers operating over a wide range of wavelengths, and particularly for semiconductor injection lasers having these properties. Since these lasers are compact, light in weight and are easily produced on a mass production scale, semiconductor injection lasers play an important role as the light source in both optical communications and optical information processing systems.

Generally, a typical optical communications system transmitting at several different wavelengths first couples the outputs from several lasers to several optical fibers. Then, the outputs from the optical fibers are coupled into a single transmission optical fiber. The total accumulated optical coupling loss in such a system tends to be large.

One technique aimed at reducing this coupling loss involves placing several lasers on the same substrate. Nevertheless, this necessitates using complicated waveguide structures to couple the light from the spatially separate lasers into a single fiber. As a result, these devices still possess high coupling losses.

SUMMARY OF THE INVENTION

Injection current structure embodiments of the present invention advantageously provide broadband, continuously tunable laser and/or amplified light output from a single output port.

Specifically, an injection laser fabricated in accordance with the teachings of the present invention comprises a laser cavity having first and second active laser regions disposed in tandem therein, means for injecting current into the first and second active laser regions to provide gain distributions over wavelength regions in the two active laser regions which partially overlap to form a combined gain distribution over a range of wavelengths, and means for providing wavelength selective loss for radiation having a wavelength within that range.

In various embodiments of the present invention, the means for providing wavelength selective loss is either a wavelength selective reflector or means for coupling energy out of the active laser regions. Moreover, the wavelength of the output radiation in various embodiments is determined by the values of the injected current density in the two active laser regions and the relative magnitudes of the loss at specific wavelengths.

BRIEF DESCRIPTION OF THE DRAWING

A complete understanding of the present invention may be gained from considering the following detailed description in connection with the accompanying drawing in which.

To facilitate understanding, identical reference numerals are used to designate identical elements common to the figures.

DETAILED DESCRIPTION

Figure 1:
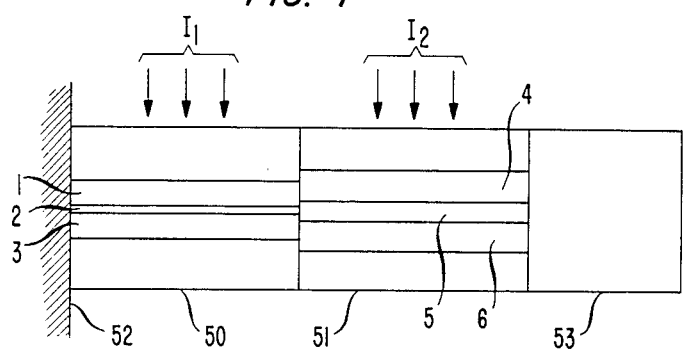
FIG. 1 shows, in block form, the general structure of various embodiments of the present invention.

To simplify and clarify the drawing, only sufficient detail is shown in the figures to enable one skilled in the art to understand the operation of the inventive structure shown therein. This drawing, along with the following materials and the knowledge of those skilled in the art, enable structures suitable for various applications to be fabricated.

FIG. 1 shows, in block form, the general structure of injection lasers constructed in accordance with the present invention. In particular, active laser regions 50 and 51, comprising layers 1, 2 and 3 and 4, 5 and 6, respectively, are disposed in a laser cavity formed by broadband mirror 52 and wavelength selective reflector 53. Active laser regions 50 and 51 are pumped by injected currents $I_1$ and $I_2$, respectively. Mirror 53 has variable values of reflectivity and thereby provides wavelength selective loss in the laser cavity.

Figure 2:
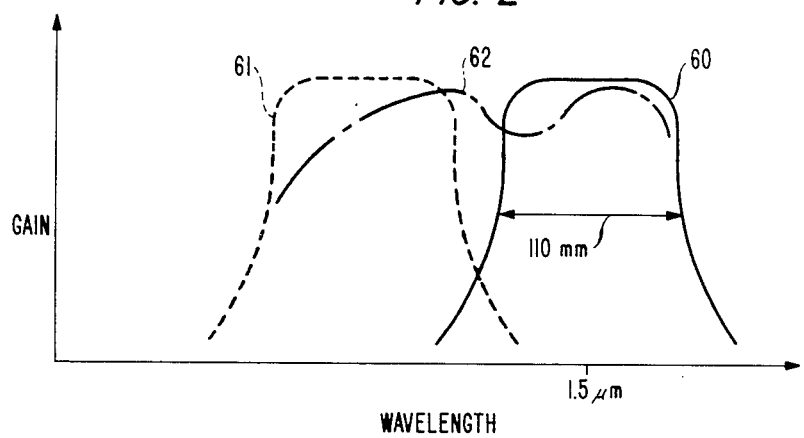
FIG. 2 shows, in graphical form, the gain distribution of each active laser region and the combined gain distribution of the structure shown in FIG. 1.

FIG. 2 shows, in graphical form, the gain distributions 60 and 61 of active laser regions 50 and 51, respectively, as a function of wavelength. In particular, for an embodiment where layers 2 and 5 comprise alloys of InGaAsP, the line width of gain distributions 60 and 61 is about 110 nanometers. Gain distribution 60 in FIG. 2 is centered at 1.5 microns.

In a typical single section Fabry-Perot cavity, the laser cavity is above laser threshold for a narrower wavelength range than is shown for either gain distribution 60 or 61. By using a sharply tuned reflector, a single section laser can be made to oscillate over a range of perhaps 50 nanometers. However, when both active laser regions 50 and 51 in FIG. 1 are pumped above threshold so that gain distributions 60 and 61 overlap, as shown in FIG. 2, the combined gain distribution of the structure, shown by curve 62 in FIG. 2, is broader than the gain distribution of either active laser region alone. Thus, when the reflectivity of wavelength selective reflector 53 peaks anywhere in the broad region of wavelengths covered by gain distribution curve 62, the structure will oscillate.

The structure shown in FIG. 1 will operate as a broadband amplifier instead of a laser when anti-reflection coatings are substituted for mirrors 52 and 53. Furthermore, if an anti-reflection coating is used instead of mirror 52 and a wavelength selective transmitter is used instead of mirror 53, the structure will operate as a wavelength selective amplifier. Anti-reflection coatings used to fabricate light emitting diodes are well known in the art, as is the use of multilayered dielectric coatings for fabricating narrowband transmission filters. An example of a single layer anti-reflection coating is shown in an article entitled "High-Quality Anti-Reflection Coating on Laser Facets by Sputtered Silicon Nitride" by G. Eisenstein and L. W. Stulz", *Appl. Opt*, Vol. 23, No. 1, Jan. 1, 1984, pp. 161-164.

Figure 3:
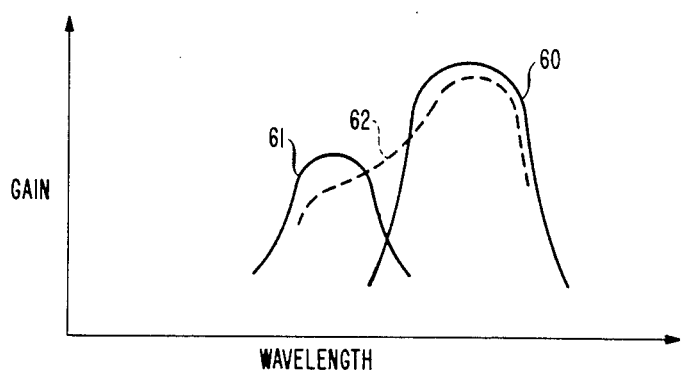
FIGS. 3 and 4 show, in graphical form, the gain distribution of each active laser region and the combined gain distribution of the structure shown in FIG. 1 for various values of injection current in the active laser regions.
Figure 4:
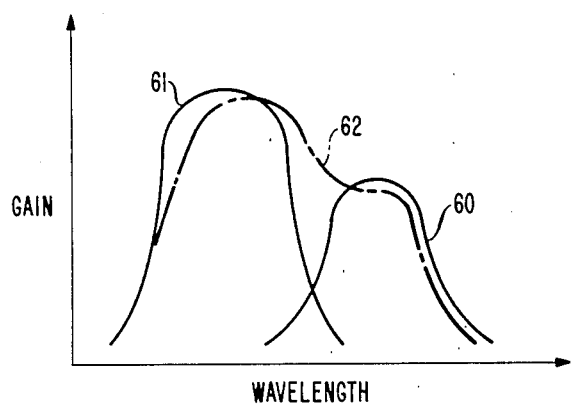

In further embodiments of the present invention, the shape of combined gain distribution 62 can be changed dynamically from the shape shown in FIG. 2 to the shapes shown in FIGS. 3 and 4 by varying the amount of current $I_1$ and $I_2$ injected into active laser regions 50 and 51, respectively.

In general, embodiments of the present invention which use wavelength selective loss elements fabricated from $LiNbO_3$ can have the peak value of their wavelength selective loss switched at a rate of 5 GHz or more. Hence, such embodiments can provide wideband analog or digital modulation.

Figure 5:
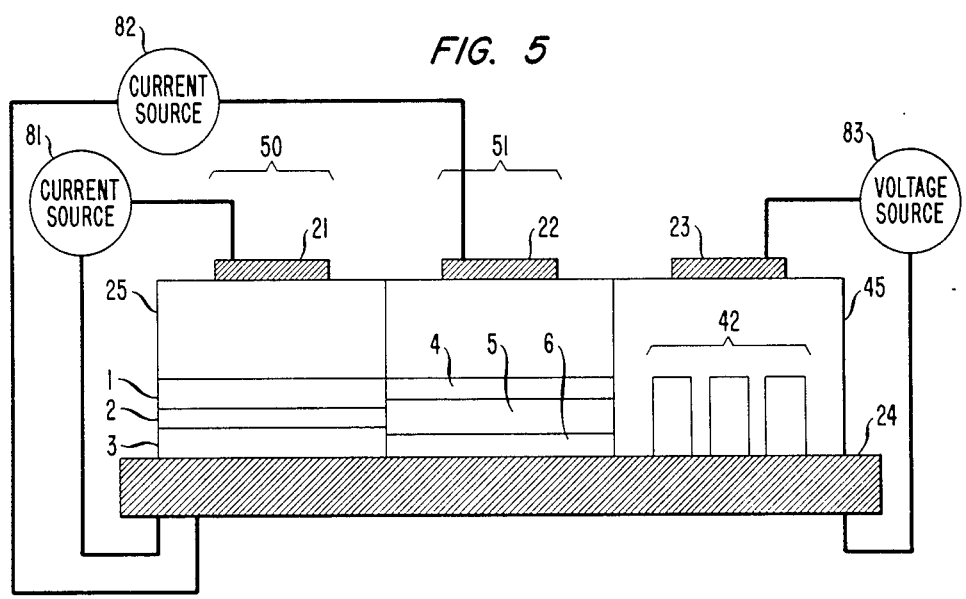
FIG. 5 shows, in pictorial form, a semiconductor embodiment of the present invention utilizing a variable reflection grating.

FIG. 5 shows an embodiment of the present invention fabricated from semiconductor materials. In particular, this figure shows a slice through the embodiment taken substantially perpendicular to the top and bottom surfaces and along its longitudinal axis, i.e., the latter being the direction of laser beam propagation in the laser cavity. For example, active laser regions 50 and 51 may each be fabricated from layers of III-V compounds or alloys of III-V materials. FIG. 5 shows both active laser regions 50 and 51 disposed on heat sink 24 which also serves as one electrode for the various voltage and current sources. Here, end 25 of the laser cavity is a simple cleaved facet. However, in practice it may be a more complex structure such as a broadband metallic or dielectric coating.

As shown in this figure, grooved grating 42 provides wavelength selective reflectivity. This grating is fabricated from $LiNbO_3$ and its grooves may be filled with air or a low index dielectric such as epoxy, $SiO_2$ or SiN. In this embodiment, the electro-optic effect is used to alter the wavelength selective reflectivity of the grating. Metallic electrode 23 is deposited on substrate 45 and is illustratively on the order of 3 to 10 microns wide. Variable voltage source 83 is connected to electrodes 23 and 24 to vary the reflectivity of grating 42.

Metallic electrodes 21 and 22 are placed on top of active laser regions 50 and 51, respectively. Variable current sources 81 and 82 are connected to metallic electrode pairs 21 and 24 and 22 and 24, respectively, to apply varying amounts of injection current to active laser regions 50 and 51.

Alternative embodiments of the present invention are fabricated by butt-joining wavelength selective reflectors to active laser regions 50 and 51 shown in FIG. 5.

In order to provide single mode laser output, the transverse structure of the laser must be designed to maintain a single transverse mode. Many methods are known in the art for fabricating structures having a single transverse mode, e.g., buried heterostructures, dual-channeled buried heterostructures, ridge or rib waveguides and stripe contact defined structures.

Figure 6:
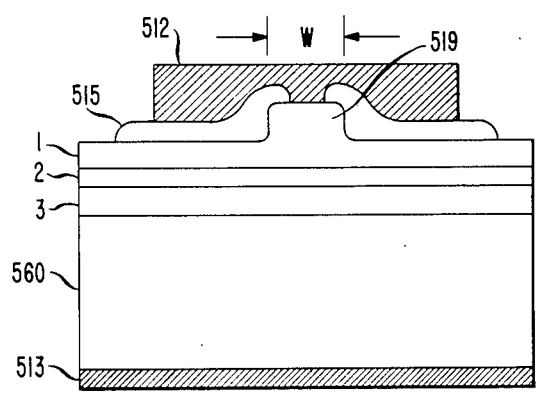
FIG. 6 shows, in pictorial form, a cross section of an active laser region of an embodiment of the present invention in which a ridge waveguide structure is used to provide transverse guidance of the lightwave in the active laser region.

Any one of the many standard laser structures may be used to guide the laser beam in the transverse plane perpendicular to the direction of propagation of the laser beam. For example, a version of a ridge waveguide is shown in FIG. 6 which depicts a slice taken, through one of the active laser regions of an embodiment of the present invention, in a plane perpendicular to the direction of propagation of the lightwave beam. Specifically, layer 1 has ridge 519 of width W and is partially covered by SiN insulating layer 515. To maintain a single transverse mode, W is approximately 5 microns. Ridge 519 can be fabricated to extend across the entire length of the structure, i.e., covering both active laser regions 50 and 51. Layers 512 and 513 are metallic contact layers.

Figure 7:
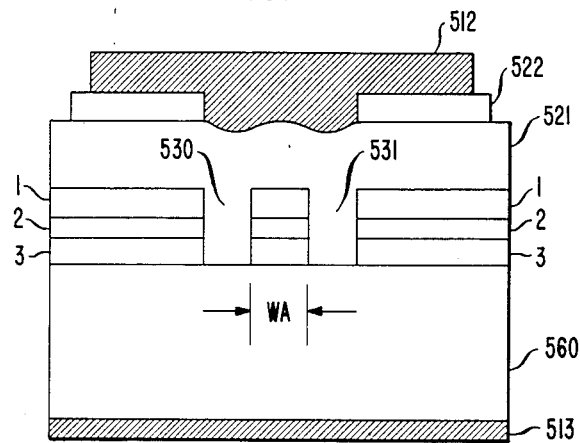
FIG. 7 shows, in pictorial form, a cross section of an active laser region of an embodiment of the present invention in which a dual-channel buried heterostructure is used to provide transverse guidance of the lightwave in the active laser region.

Another structure for providing transverse guidance in active laser regions 50 and 51 is a dual-channel buried heterostructure. This is shown in FIG. 7. After growing layers 3, 2, and 1 on substrate 560, a pair of channels, 530 and 531, are etched to leave a mesa having width WA. Then, lower index layer 521, often InP, which serves as a confining region, is grown in the groove. Channels 530 and 531 may extend the entire length of the laser structure. Layers 512 and 513 are metallic contact layers; layer 560 is an n-InP substrate; layer 3 is an n-InGaAsP layer; layer 2 is a p-InGaAsP layer; layer 1 is a p-InP layer; layer 521 is a p-InP layer and layer 522 is a $SiO_2$ layer. An example of such a dual-channel buried heterostructure is shown in the *Technical Digest OFC '84 O.S.A. Meeting on Optical Fiber Communication Jan.* 23-25, 1984, paper MF2, FIG. 1, page 15.

Another well-known structure, not shown in the figures, for providing transverse guidance in active laser regions 50 and 51 is a stripe-contact current injection structure.

The structures providing transverse guidance in active laser regions 50 and 51 may optionally be fabricated by bombarding the areas adjacent to active laser regions 50 and 51 to make them highly resistive instead of using insulating layers as previously described.

Further embodiments of the present invention can be fabricated by utilizing the novel wavelength selective loss structures disclosed in my co-pending U.S. patent application Ser. No. 655,257 entitled "Single Mode Injection Laser Structure", U.S. Pat. No. 4,639,922, which has been filed on Sept. 28, 1984 and which is incorporated by reference herein.

Figure 8:
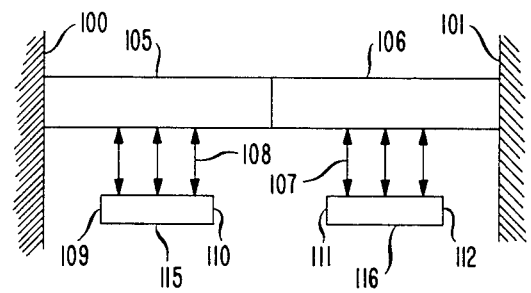
FIG. 8 shows, in pictorial form, the general structure of various embodiments of the present invention in which lightwave coupling between active laser waveguides and auxiliary light guiding sections is used to provide wavelength selective loss.
Figure 9:
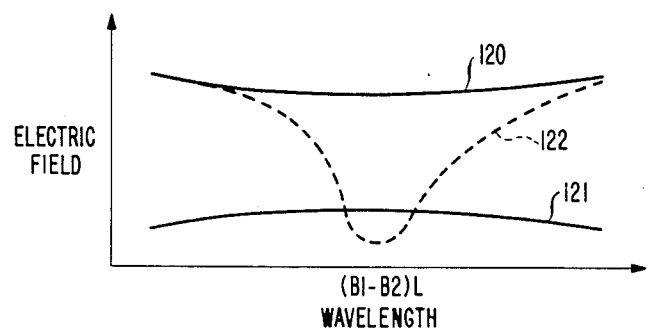
FIG. 9 shows, in graphical form, the electric fields in both an active laser waveguide section and an auxiliary light guiding section of FIG. 8 which result from the lightwave coupling therebetween, as a function of wavelength.

FIG. 8 depicts the general structure of various embodiments of the present invention using a novel means to provide wavelength selective loss. In particular, this figure shows a view looking down at the top of an injection laser structure. Active laser waveguide section 105 and 106 are disposed between broadband mirrors 100 and 101 which, in turn, form a laser cavity. As indicated by arrows 107 and 108, active waveguide sections 105 and 106 and auxiliary light guiding sections 115 and 116 are situated so that light is continuously coupled from active waveguide sections 105 and 106 to auxiliary light guiding sections 115 and 116, respectively. The coupling between these sections causes notable transfer of power therebetween. If the phase constants of each pair of sections differ, the power transfer is wavelength selective. Furthermore, by making the gain of auxiliary light guiding sections 115 and 116 greater than the gain of active laser waveguide sections 105 and 106, respectively, the effect can be enhanced. This is shown graphically in FIG. 9. Here, curve 120 represents the electric field in section 105 or 106 and curve 121 represents the electric field in section 115 and 116 when there is equal gain between each pair of sections. Dotted curve 122 represents the electric field in section 105 or 106 when there is larger gain in section 115 or 116. With larger gain in auxiliary light guiding section 115 or 116 than in the corresponding active laser waveguide section 105 or 106, waves coupled over to the auxiliary light guiding section are amplified faster than waves in the corresponding active laser waveguide section. Thus, waves which are subsequently coupled out of an auxiliary light guiding section and back into the corresponding active laser waveguide section, out of phase with waves in the corresponding active laser waveguide section, do a more effective job of canceling out lasing section waves than if the gain in an auxiliary light guiding section was lower.

A larger gain in auxiliary light guiding section 115 or 116 can advantageously be obtained by pumping these sections with a larger current density than that used to pump active laser waveguide sections 105 and 106. The dimensions of the two waveguide pairs, i.e., sections 105 and 115 and sections 106 and 116, are chosen to obtain the desired difference in phase constant therebetween. In FIG. 8, ends 109 and 110 of auxiliary light guide section 115 and ends 111 and 112 of auxiliary light guide section 116 are terminated in lossy absorbing regions. Hence, the photon density does not build in auxiliary light guide sections 115 and 116 to the same extent it does in active laser waveguide sections 105 and 106, even for the same current density. Thus, higher gain in auxiliary light guiding sections 115 and 116 can be advantageously obtained without using a higher current density.

Specific structures for providing the coupling shown in FIG. 8 are disclosed in FIGS. 4–7 in my above-cited co-pending patent application.

It should be clear to those skilled in the art that further embodiments of the present invention can be constructed by placement of a passive waveguide between active laser regions 50 and 51 shown in FIGS. 1 and 5 and between active laser regions 105 and 106 shown in FIG. 8.

Figure 10:
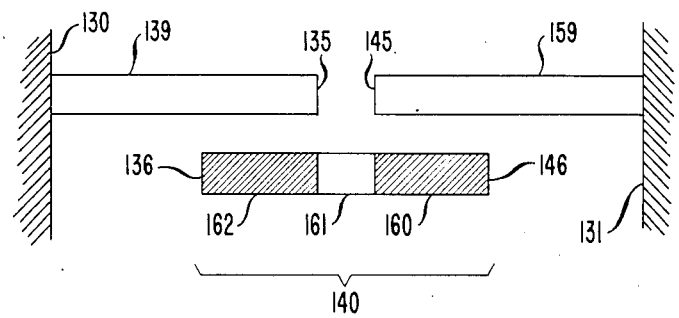
FIG. 10 shows, in pictorial form, the general structure of various embodiments of the present invention in which lightwave coupling between a portion of an active laser waveguide section and the active portion of an auxiliary light guiding section is used to provide wavelength selective loss.
Figure 11:
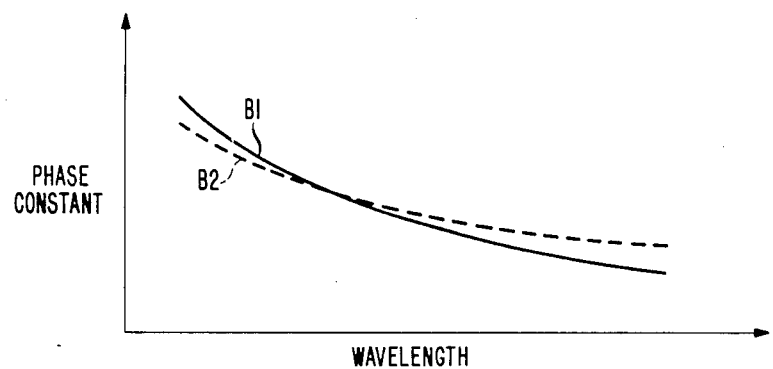
FIG. 11 shows, in graphical form, the relation between the phase constants of an active laser waveguide section and an auxiliary light guiding section for the embodiment shown in FIG. 10.

FIG. 10 shows the general structure of various embodiments of the present invention, looking down at the top of the injection laser structure, in which coupling between active portions of transmission lines 139 and 140—having lossy terminations 135 and 136, respectively—and active portions of transmission lines 159 and 140—having lossy terminations 145 and 146, respectively—provides wavelength selective loss. Specifically, transmission line 140 comprises active regions 160 and 162 separated by passive region 161. Current is injected into transmission lines 139 and 159 along their entire length. Current is injected into transmission line 140 in regions 160 and 162. Mirrors 130 and 131 are broadband mirrors and form a laser cavity. Transmission line pairs 139 and 161 and 159 and 160 are fabricated to have phase constants which are equal at one wavelength and unequal at all others. This is accomplished by forming transmission line structures having different transverse dimensions and from materials having different indexes of refraction. The resulting wavelength dependent phase constants of each pair are graphically shown in FIG. 11, as more fully described in my prior application identified above.

The relatively broadband coupling between transmission line pairs 139 and 162 and 159 and 160 causes appreciable power transfer at a specific wavelength, but little net power transfer at other wavelengths.

Specific structures providing the desired wavelength selective coupling are disclosed in FIGS. 10–13 of my above-cited co-pending patent application.

Figure 12:
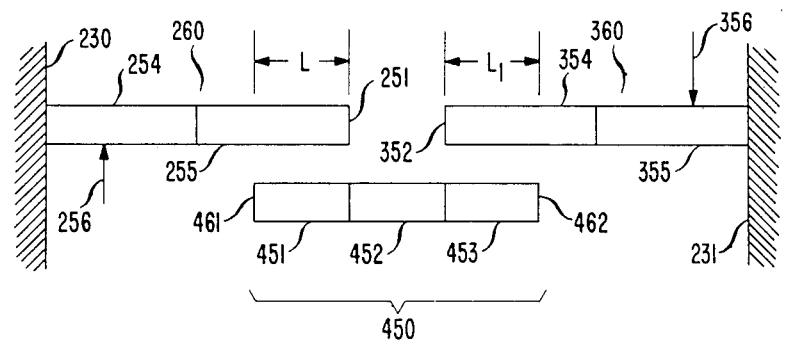
FIG. 12 shows, in pictorial form, an embodiment of the present invention in which coupling between passive regions in two pairs of transmission lines is used to provide wavelength selective loss.

FIG. 12 shows a top view of a further embodiment of the present invention which is similar to the embodiment shown in FIG. 10. Here, distributed coupling is provided between passive sections in the waveguides. Specifically, transmission line 260 has active region 254 and passive region 255. Active region 254 is pumped by injection current as shown by arrow 256. Transmission line 360 is pumped by injection current as shown by arrow 356. Transmission line 450 is a passive region made up of passive regions 451, 452, and 453. The transmission lines 260, 360 and 450 have lossy terminations, 251, 352, 461 and 462, respectively. Broadband mirrors 230 and 231 form a laser cavity. Transmission lines 260 and 450 are coupled to transfer energy in passive coupling regions 255 and 451 over a length L. Transmission lines 360 and 450 are coupled to transfer energy in passive coupling regions 354 and 453 over a length $L_1$. Illustratively, passive coupling regions 255, 451, 354 and 453 can be fabricated from $LiNbO_3$. Furthermore, passive coupling regions 255, 451, 354 and 453 can be subjected to a variable electric field, by means of voltages applied to electrodes deposited over the passive regions in order to utilize the electro-optic effect to tune the value of the desired oscillation frequency. Coupling between passive waveguide sections using $LiNbO_3$ has been disclosed to the art in an article entitled "Tunable Optical Waveguide Directional Coupler Filter" by R. C. Alferness and R. V. Schmidt in *Applied Physics Letters*, Vol. 33 No. 2, 15 July 1978, p. 161. Furthermore, the wavelength selective passive coupling region pairs 255 and 451 and/or 354 and 453 may be fabricated from fused silica in order to provide excellent stability against temperature variations.

Lossy termination 251 in transmission line 260 and lossy termination 352 in transmission line 360 may be achieved by not injecting current into regions 255 and 355 in otherwise continuous structures 260 and 360, respectively.

It should be clear to those skilled in the art that the injection current structures shown in FIGS. 8, 10 and 12 will operate as amplifiers instead of as lasers when antireflection coatings are substituted for the mirrors described hereinabove.

Clearly, many other varied embodiments may be constructed by those skilled in the art without departing from the spirit and scope of the present invention.

What is claimed is:

1. An injection laser which comprises first and second active laser regions having first and second ends, wherein the first and second active laser regions are disposed against one another at the second ends thereof,
   first and second means for injection pumping the first and second active laser region to produce gain over a wavelength region in each the wavelength at which the gain of the first active laser region is a maximum being different than the wavelength at which the gain of the second active laser region is a maximum, the wavelength regions overlapping to produce a combined gain distribution over a broader wavelength region than the wavelength regions of either the first or second active laser regions alone,
   a partial reflector of laser radiation generated at the first end of the first active laser region, and
   a wavelength selective partial reflector of the laser radiation disposed at the first end of the second active laser region to form a laser cavity between the partial reflector and the wavelength selective partial reflector.

2. The injection laser claimed in accordance with claim 1 wherein the wavelength selective reflector is a multilayered dielectric.

3. The injection laser claimed in accordance with claim 1 wherein the wavelength selective reflector is a grating.

4. The injection laser claimed in accordance with claim 3 wherein the wavelength selective reflector further comprises metal electrodes disposed across the grating and a variable source of voltage applied across the electrodes, whereby a variable electric field is applied to the grating.

5. The injection laser of claim 1 wherein the first and second active laser regions are a buried heterostructure.

6. The injection laser of claim 1 wherein the first and second active laser regions are a dual-channel buried heterostructure.

7. The injection laser of claim 1 wherein the first and second active regions are a ridge waveguide structure.

8. An injection laser which comprises:
   a first active laser region having first and second ends, the first end being a partial reflector of laser radiation generated in the injection laser,
   a second active laser region having first and second ends, wherein the first active laser region are disposed against one another at the second ends thereof,
   a partial reflector of laser radiation disposed at the first end of the second active laser region to form a laser cavity with the first end of the first active laser region,
   first and second means for injection pumping the first and second active laser regions to produce gain over a wavelength region in each, the wavelength at which the gain of the first active laser region is a maximum being different than the wavelength at which the gain of the second active region is a maximum, the wavelength regions overlapping to produce a combined gain distribution over a broader wavelength region than the wavelength regions of either the first or second active laser regions alone, and
   first and second auxiliary light guiding means disposed in a physical, relationship with the first and second active laser regions, respectively, so that laser radiation is coupled between each auxiliary light guiding means and its corresponding active laser region in order to provide wavelength selective energy loss.

9. An injection laser which comprises:
   first and second active laser regions each having first and second ends, the first end of each being a partial reflector of laser radiation generated in the injection laser, wherein the first and second active laser regions are disposed adjacent one another at the second ends thereof to form a laser cavity between the first ends,
   first and second means for injection pumping the first and second active laser regions to produce gain over a wavelength region in each, the wavelength at which the gain of the first active laser region is a maximum being different than the wavelength at which the gain of the second active region is a maximum, the wavelength regions ovelapping to produce a combined gain distribution over a broader wavelength region than the wavelength regions of either the first or second active laser regions alone, and
   first and second auxiliary light guiding means disposed in a physical relationship with the first and second active laser regions, respectively, so that laser radiation is coupled between each auxiliary light guiding means and its corresponding active laser region in order to provide wavelength selective energy loss.

10. The injection laser of claim 9 wherein the first and second auxiliary light guiding means are waveguides.

11. The injection laser claimed in accordance with claim 10 wherein the waveguides have an active gain region and the injection laser further comprises means for injection pumping the active gain region in the waveguides.

12. The injection laser claimed in accordance with claim 11 wherein the gain of the waveguides is higher than the gain of the active laser regions.

13. The injection laser claimed in accordance with claim 12 wherein the waveguides have lossy terminations for the laser radiation.

14. The injection laser claimed in accordance with claims 1, 8 or 9 wherein a passive waveguide is disposed between the second ends of the first and second active laser regions.

15. An injection laser which comprises:
   first and second active laser regions each having first and second ends, the first end of each being a partial reflector of laser radiation generated in the injection laser, wherein the first ends are disposed to form a laser cavity therebetween,
   first and second means for injection pumping the first and second active laser regions to produce gain over a wavelength region in each, wherein the wavelength regions overlap,
   an auxiliary light guiding section comprising first and second active regions, and
   first and second means for providing variable gain in the first and second active regions of the auxiliary guiding section, the auxiliary light guiding section being disposed so that laser radiation is coupled between the first active laser region and the first active region and between the second active laser region and the second active region to provide wavelength selective energy loss.

16. An injection laser which comprises:

first and second active laser regions each having first and second ends, the first end of the first active laser region being a partial reflector of laser radiation generated in the injection laser, a partial reflector of laser radiation generated in the injection laser, the partial reflector being disposed at the first end of the second active laser region to form a laser cavity with the first end of the first active laser region, first and second means for injection pumping the active laser regions to produce gain over a wavelength region in each, wherein the wavelength regions overlap, an auxiliary light guiding section comprising first and second active regions, and first and second means for providing variable gain in the first and second active regions of the auxiliary guiding section, the auxiliary light guiding section being disposed so that laser radiation is coupled between the first active laser region and the first active region and between the second active laser region and the second active region to provide wavelength selective energy loss.

17. The injection laser claimed in accordance with claim 16 wherein the ends of the auxiliary light guiding section and the second end of the active laser regions are lossy terminations for the laser radiation.

18. The injection laser claimed in accordance with claim 17 wherein the phase constants of the first active laser region and the first active region of the auxiliary light guiding section are equal at only one value of wavelength.

19. The injection laser claimed in accordance with claim 17 wherein the first active laser region and first active region of the auxiliary light guiding section have different widths and indexes of refraction.

20. An injection laser which comprises:

first and second transmission waveguides each comprising an active laser region having a first end which is a partial reflector of laser radiation generated in the injection laser and a passive region having a second end, the first ends being disposed to form a laser cavity therebetween, first and second means for injection pumping the active laser regions to produce gain over a wavelength region in each, wherein the gain regions overlap, and an auxiliary light guiding section having first and second passive regions and first and second ends, wherein the first and second transmission waveguides and the auxiliary light guiding section are disposed so that laser radiation is coupled between the passive regions of each to provide wavelength selective loss of energy.

21. An injection laser which comprises:

first and second transmission waveguides each comprising an active laser region having a first ends and a passive region having a second end, the first end of the first transmission waveguide being a partial reflector of laser radiation generated in the injection laser, a partial reflector of the laser radiation disposed at the first end of the second waveguide to form a laser cavity with the first end of the first transmission waveguide, first and second means for injection pumping the active laser regions to produce gain over a wavelength region in each, wherein the gain regions overlap, and an auxiliary light guiding section having first and second passive regions and first and second ends, wherein the first and second transmission waveguides and the auxiliary light guiding section are disposed so that laser radiation is coupled between the passive regions of each to provide wavelength selective loss of energy.

22. The injection laser claimed in accordance with claim 21 wherein the first and second ends of the auxiliary light guiding section and the second ends of the first and second transmission waveguides are lossy terminations for the laser radiation.

23. The injection laser claimed in accordance with claim 21 wherein the passive regions are $LiNbO_3$ layers.

24. The injection laser claimed in accordance with claim 23 which further comprises metal electrodes disposed across the passive regions and first and second variable sources of voltage connected to the electrodes whereby the phase constants and the coupling between the passive regions may be varied.

25. The injection laser claimed in accordance with claims 1, 8, 9, 15, 16, 20 or 21 wherein the first and second means for injection pumping the first and second active laser regions are means for injection pumping a variable amount of current.

* * * * *

UNITED STATES PATENT AND TRADEMARK OFFICE
CERTIFICATE OF CORRECTION

PATENT NO. : 4,680,769

DATED : July 14, 1987

INVENTOR(S) : Stewart E. Miller

It is certified that error appears in the above-identified patent and that said Letters Patent is hereby corrected as shown below:

In the Abstract, line 10, after "wavelength" ad --selective loss for radiation having a wavelength--. Line 12 after "selective" add --loss is either wavelength selective--.

Signed and Sealed this

Twenty-fourth Day of May, 1988

*Attest:*

DONALD J. QUIGG

*Attesting Officer*       *Commissioner of Patents and Trademarks*